(12) United States Patent
Cottone et al.

(10) Patent No.: US 8,550,765 B2
(45) Date of Patent: Oct. 8, 2013

(54) APPARATUS AND METHOD FOR RECEIVING AND TRANSFERRING GLASS SUBSTRATE PLATES

(75) Inventors: Norbert Cottone, Zusmarshausen (DE); Martin Peghini, Augsburg (DE)

(73) Assignee: KUKA Roboter GmbH, Augsburg (DE)

( * ) Notice: Subject to any disclaimer, the term of this patent is extended or adjusted under 35 U.S.C. 154(b) by 1002 days.

(21) Appl. No.: 11/758,241

(22) Filed: Jun. 5, 2007

(65) Prior Publication Data
US 2007/0289383 A1    Dec. 20, 2007

(30) Foreign Application Priority Data
Jun. 6, 2006   (DE) .......................... 10 2006 026 503

(51) Int. Cl.
*B66C 23/00*   (2006.01)

(52) U.S. Cl.
USPC ...................................... 414/744.3

(58) Field of Classification Search
USPC ............... 414/941, 222.01, 736, 737, 222.09, 414/222.11, 228, 229, 936, 937, 939, 217, 414/927, 785, 763, 668, 664, 450, 331.07, 414/331.04, 331.01, 226.01, 225.01, 790.2, 414/541, 619, 630, 662, 663, 331.09, 687; 414/744.1, 744.2, 744.3, 744.8; 193/35 R; 198/347.3, 347.4; 355/72, 407; 73/504.16; 901/15, 17, 40
See application file for complete search history.

(56) References Cited

U.S. PATENT DOCUMENTS

| | | | | |
|---|---|---|---|---|
| 2,782,065 A * | 2/1957 | Lord | .............................. | 294/87.1 |
| 2,782,066 A * | 2/1957 | Lord | .............................. | 294/99.1 |
| 2,938,595 A * | 5/1960 | Miller | ............................ | 182/129 |
| 3,187,917 A * | 6/1965 | Miller | ............................ | 414/664 |
| 3,426,927 A * | 2/1969 | Woodward | ..................... | 414/620 |
| 3,941,257 A * | 3/1976 | Matsuura | ....................... | 414/233 |
| 4,573,863 A * | 3/1986 | Picotte | ............................ | 414/763 |
| 5,035,562 A * | 7/1991 | Rosen | ............................ | 414/240 |
| 5,215,427 A * | 6/1993 | Olsthoorn et al. | ............. | 414/664 |
| 5,261,146 A * | 11/1993 | Belliot | ............................ | 26/18.6 |
| 5,509,774 A * | 4/1996 | Yoo | ............................... | 414/622 |
| 5,549,442 A * | 8/1996 | Corey | ........................ | 414/751.1 |
| 5,664,931 A * | 9/1997 | Brugger et al. | ........... | 414/416.01 |
| 5,860,784 A * | 1/1999 | Schuitema et al. | ........... | 414/280 |
| 5,989,346 A * | 11/1999 | Hiroki | ............................ | 118/719 |
| 6,082,797 A * | 7/2000 | Antonette | .................... | 294/103.1 |
| 6,189,943 B1 * | 2/2001 | Manpuku et al. | ............. | 294/183 |
| 6,623,235 B2 * | 9/2003 | Yokota et al. | .............. | 414/744.8 |
| 6,681,916 B2 * | 1/2004 | Hiroki | ......................... | 198/347.1 |
| 6,942,087 B2 * | 9/2005 | Meyer | ........................... | 198/427 |
| 6,962,669 B2 * | 11/2005 | Foreman et al. | .............. | 264/1.36 |
| 7,751,939 B2 * | 7/2010 | Cho et al. | ....................... | 700/254 |
| 2004/0240979 A1 | 12/2004 | Beavers et al. | | |
| 2005/0095106 A1 * | 5/2005 | Pearce | ........................... | 414/627 |
| 2005/0199346 A1 | 9/2005 | Miyajima et al. | | |
| 2006/0139616 A1 * | 6/2006 | Jacobs et al. | ..................... | 355/75 |
| 2006/0182508 A1 * | 8/2006 | Clive-Smith | ...................... | 410/3 |
| 2006/0245853 A1 * | 11/2006 | Okuno | ............................ | 414/217 |

* cited by examiner

FOREIGN PATENT DOCUMENTS

JP    2005230941    9/2005

*Primary Examiner* — Saul Rodriguez
*Assistant Examiner* — Glenn Myers
(74) *Attorney, Agent, or Firm* — Wood, Herron & Evans, LLP (57) ABSTRACT

An apparatus for transferring and accepting glass substrate plates includes a double fork gripper having two superimposed, individual fork grippers that are movable relative to one another perpendicular to their extension planes. The fork grippers may be inserted simultaneously therewith into a receiving station having at least two depositing planes so that relative movement of the individual fork grippers perpendicular to their extension planes transfers a glass substrate plate to the receiving station and receives another plate from the receiving station.

10 Claims, 8 Drawing Sheets

APPARATUS AND METHOD FOR RECEIVING AND TRANSFERRING GLASS SUBSTRATE PLATES

FIELD OF THE INVENTION

The invention relates to an apparatus for transferring and accepting glass substrate plates with a double fork gripper with two superimposed, individual fork grippers, a feed unit for guiding glass substrate plates to and from a process station treating the same and having at least one conveying mechanism conveying the glass plates into and out of the process station, as well as a method for accepting and transferring glass substrate plates from and to a receiving station, such as a feed unit or a storage cassette.

BACKGROUND OF THE INVENTION

Said glass substrate plates or flat panel displays (FPD) are used for producing individual LCD displays, which are cut out of the glass substrate plates. The glass substrate plates must for this purpose be treated in a treatment process, which implies material deposition, irradiation, etching, etc. and to this end they must be introduced into and removed from a process station again.

After treatment, the glass substrate plates have a process side to which the LCD is applied. They also have a nonprocess side. To avoid quality deterioration, during production and transportation contacts necessary as a result of gripping or depositing the glass substrate plates must only occur on the nonprocess side, but never on the process side. Thus, the glass plates must always be gripped on one side.

During the production process the glass substrate plates are stored in magazines or so-called cassettes and in this way are conveyed to the process station. For the storage of the glass substrate plates in the cassettes, they are stored on the nonprocess side in horizontal orientation in the cassette. As a function of the glass substrate size, there can be up to 50 glass plates in a cassette. For this purpose the glass substrate plates rest on retaining arms within the cassette.

For the production process the glass substrate plates must be removed from the cassette and deposited at process stations (prior to process treatment) or received (following process treatment). The transfer interface at the process station is i.a. defined as a roller conveyor on which can be deposited a glass substrate plate, once again on the nonprocess side. Besides process stations with feed units, there are also process stations in which the glass substrate plates are placed in a direct manner and consequently there is no need for a feed unit. On conclusion of the given process, the glass substrate plate must once again be removed from the process station (frequently via the same interface) and placed in the cassette.

Handling from or into cassettes and process stations nowadays takes place by means of lifting mechanisms, which are located directly at the transfer interface of the process stations or with the aid of robots specifically developed for this purpose and having corresponding gripping tools. Gripping (receiving and depositing) of the glass substrate plates in the latter case takes place with the aid of a gripper, which is equipped with fork elements (fork grippers). The arrangement of the forks is chosen in such a way that they can be positioned between the retaining arms within the cassette or between the rollers of the feed units. The forks are then in each case located below the glass substrate plate to be received (nonprocess side).

In order to prevent a slipping of the glass substrate plates on the gripping forks, they are generally equipped with vacuum suction pads and therefore ensure a nonpositive fixing of the glass substrate plates.

In the prior art the basic handling process can be subdivided in the following way:
1. Introduction of the fork gripper into the cassette.
2. Raising the fork gripper and therefore the untreated glass substrate plate from the retaining arms within the cassette.
3. Fixing the untreated glass substrate plate to the fork gripper (e.g. by suction, clamping, etc.).
4. Removing the fork gripper with the glass substrate plate from the cassette.
5. Transporting the glass substrate plate to the process station.
6. Positioning the glass substrate plate on the feed unit or directly in the process station.
7. Releasing the fixing and depot of the glass substrate plate (fork gripper moves between the rollers or depot elements of the feed unit or process station).
8. After the end of the process raising the fork gripper and therefore the treated glass substrate plate.
9. Fixing the untreated glass substrate plate to the fork gripper (e.g. by suction, clamping, etc.).
10. Transporting the treated glass substrate plate to the cassette.
11. Insertion in the cassette.
12. Positioning the treated glass substrate plate above the retaining arms.
13. Releasing the fixing and depot of the glass substrate plate (fork gripper inserted between the retaining arms of the cassette).
14. Removing the fork gripper from the cassette and positioning the fork gripper for receiving the next untreated glass substrate plate.

As stated hereinbefore, in connection with the handling process the presently used handling systems only have the possibility of in each case transporting one glass substrate plate. This means that the robot for handling an individual glass substrate plate must be moved from the cassette to the process station feed unit and back again.

It is known to construct the grippers as double grippers, which can consequently receive two glass substrate plates. This type of gripper or handling is used in order to receive an untreated glass plate from the cassette and at the process station receive the treated glass substrate plate and without any further movement on the part of the handling device to deposit there again the next, untreated glass substrate plate. Thus, the double gripper is only used at the interface to the process station, so that it is possible to deposit an already gripped, untreated glass substrate plate on the feed unit or directly in the process station after removing the treated glass substrate plate. This economizes movements on the part of the robot and minimizes the cycle time.

As fork grippers the double grippers are superimposed and can therefore generally be moved horizontally independently of one another by means of a straight line gear. The lifting movement for depositing or receiving the glass substrate plates in the cassette or process station is, however, coupled, which leads to the disadvantage that the depositing or receiving of glass substrate plates in the cassette cannot take place simultaneously through both gripper forks and instead these two handling processes must be performed sequentially (handling process 1: inserting gripper 1 in the cassette and depositing the treated glass substrate plate; handling process 2: inserting gripper 2 in the cassette and receiving an untreated glass substrate plate). If both grippers operated simultaneously in the cassette, a treated glass substrate plate deposited by gripper 1 in the cassette would be received again when an untreated glass substrate plate was received through gripper 2. Thus, with such a double gripper solution such as is provided by the prior art, the productivity of an installation can be increased by avoiding unnecessary transportation procedures, but the sequential handling process at the cassette still takes up much time.

There is also an increased contamination risk of the lower glass substrate plate emanating from the robot arm which receives the upper fork gripper. This moves directly above the glass substrate plate. Through bearing friction on the robot arm joints particles can be detached, which can be deposited on the process side of the glass substrate plate. As great importance is attached to the requirement of particle freedom when handling glass substrate plates (clean room), these represent not inconsiderable risk factors.

Such a double gripper is e.g. described in JP 2005-230941 A. In the prior art solutions only a single fork gripper can be introduced into the cassette or process station in order to deposit or receive a glass substrate plate.

On the basis of this prior art the problem of the invention, whilst avoiding the aforementioned disadvantages, is to provide an apparatus and a method for transferring and accepting glass substrate plates, by means of which gripper movements and transportation processes are minimized and consequently it is possible to reduce the cycle time and increase productivity.

SUMMARY OF THE INVENTION

According to the invention the set problem is solved with an apparatus of the aforementioned type, which is characterized in that the fork grippers are movable relative to one another perpendicular to their extension planes. For solving the set problem the invention also provides a method which is characterized in that a double fork gripper is moved simultaneously with two superimposed individual fork grippers arranged perpendicular to their extension planes and movable relative to one another into the receiving station having at least two depositing planes and by relative movement of the individual fork grippers perpendicular to their extension planes transfers a glass substrate plate to the receiving station and receives another from the receiving station.

In order to assist the attainment of the aforementioned aims, the invention also provides for a feed unit at the process station and which is characterized by two vertically superimposed and vertically movable conveying mechanisms.

Thus, the invention provides for a modification of the double fork gripper and its kinematics more particularly in that the individual fork grippers are not only movable into and out of their extension plane independently of one another, but are also movable perpendicular to their extension planes or in the direction of their shortest mutual connection, i.e. are movable towards or away from one another and this is used in a method for receiving and transferring substrate plates from and to a receiving station, such as a feed unit, to a process station or a stakking cassette.

The invention makes it possible for both fork grippers to move both into the cassette and, in the case of a corresponding modification, into the feed unit or process station and to simultaneously implement the deposition and reception of treated and untreated glass substrate plates.

As a result of this parallelizing of the handling processes at the cassette and process station the productivity of the installation can be significantly increased. Thus, the invention parallelizes the handling process.

According to preferred developments of the inventive apparatus, the fork grippers are movable by a common drive and a coupling mechanism or gear or are in each case movable by an individual, independent drive.

Alternatively one of the fork grippers can be movable relative to the other fork gripper and a base frame carrying both grippers and that the base frame is constructed for implementing a compensating movement counter to the movement direction of the fork gripper movable relative thereto.

According to an extremely preferred development of the invention, the apparatus has a robot carrying the double gripper.

The glass substrate plates are preferably fixed to the fork grippers, said fixing taking place either in nonpositive manner, such as by suction devices, or in positive manner, such as by fixing elements acting on the glass substrate plate edge.

If there is a feed unit with conveying mechanisms, in preferred manner it is constructed in such a way that the conveying mechanisms are constructed as roller conveyors. The invention also provides a system with an inventive apparatus for receiving and transferring glass substrate plates, as well as an inventive transfer station.

When fork grippers are simultaneously introduced into the receiving station initially either a supplied glass substrate plate is deposited and subsequently a glass substrate plate to be received is removed, the two individual fork grippers preferably move simultaneously relative to one another.

According to a further development of the method, the glass substrate plates are fixed to the fork grippers, the glass substrate plates being fixed nonpositively, such as by suction action, to the fork grippers and/or the glass plates are positively fixed to the fork grippers, such as by clamping grippers acting on the edge of the glass substrate plates.

BRIEF DESCRIPTION OF THE DRAWINGS

Further advantages and features of the invention can be gathered from the claims and the following description of embodiments of the invention with reference to the attached drawings, wherein show:

FIG. 1A perspective overall view of process station, feed unit and double fork gripper moved by a robot.

FIG. 3d A larger scale representation of area A in FIG. 3a.

DETAILED DESCRIPTION OF THE DRAWINGS

Figure 1:
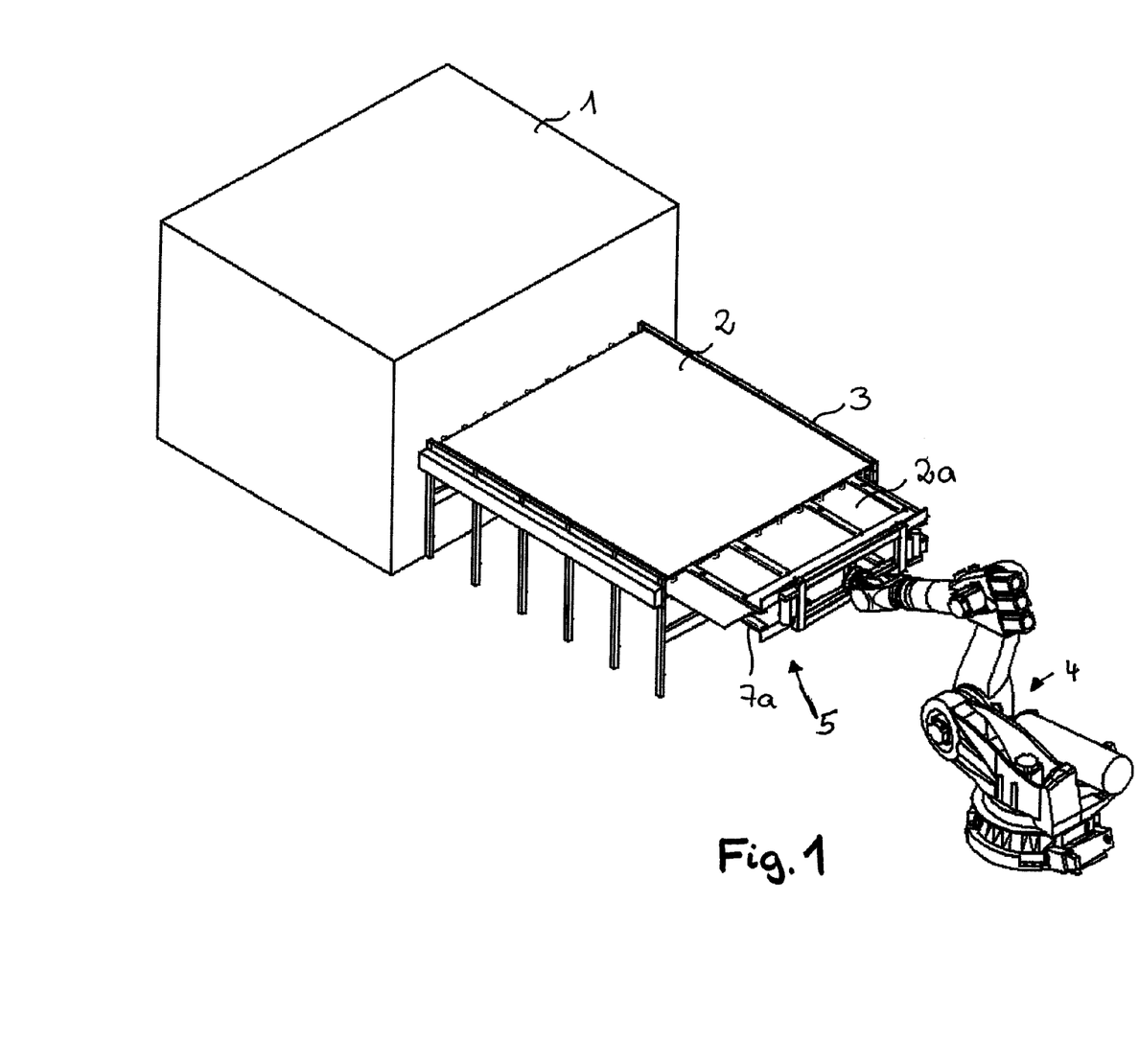
Figure 2:
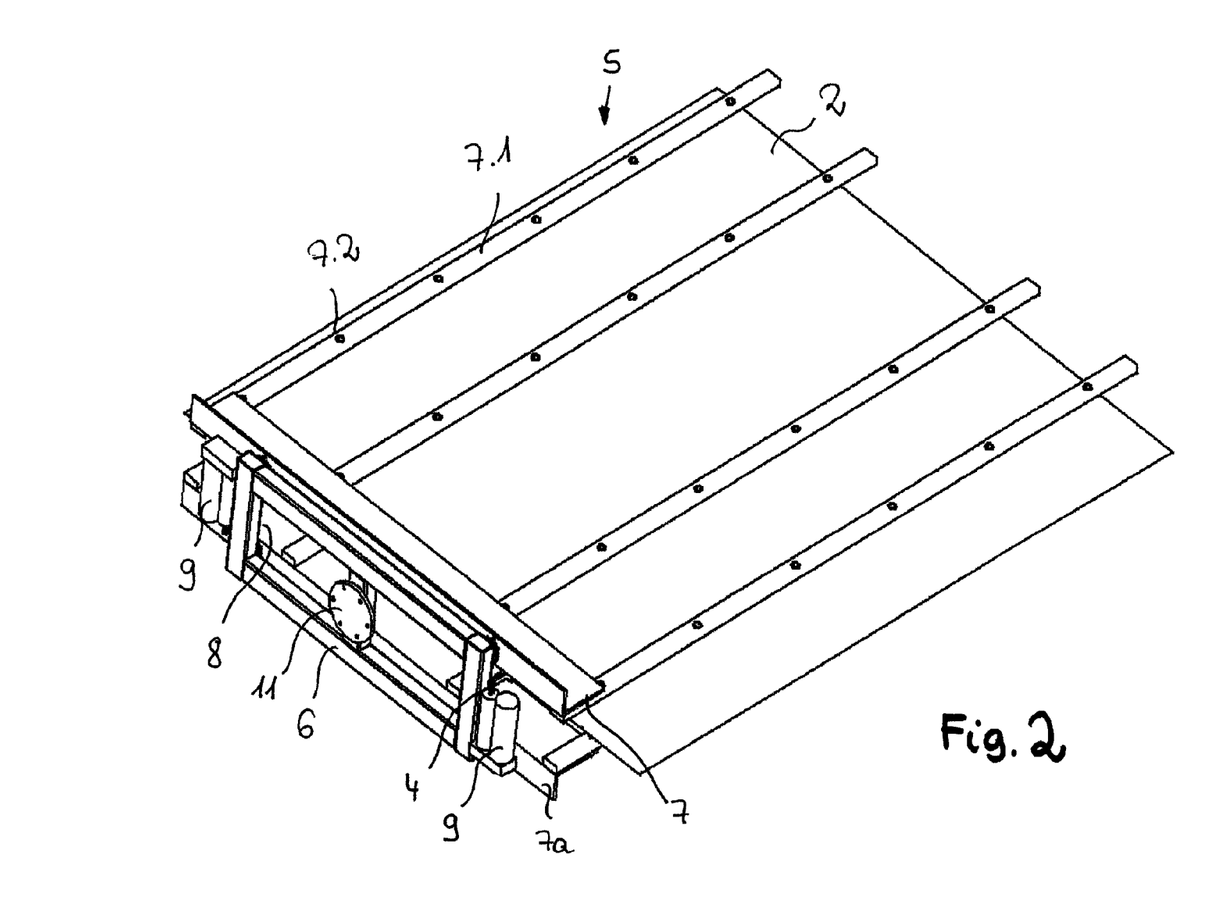
FIG. 2 A perspective representation of an inventive double fork gripper.
Figure 3A:
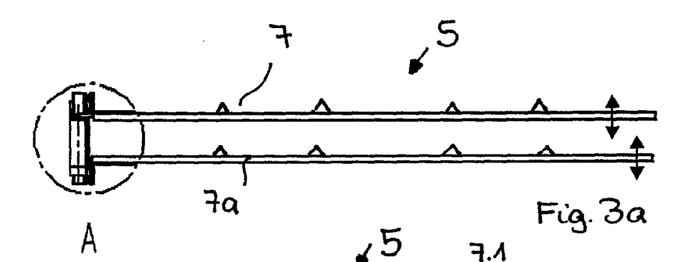
FIG. 3a-c A side view, plan view and front view of an inventive double gripper.
Figure 3B:
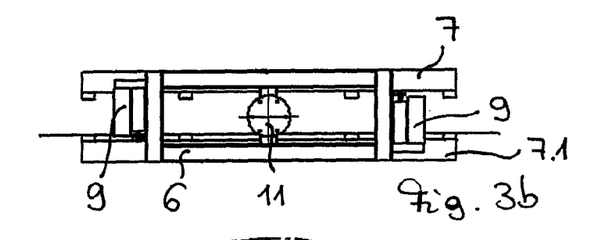
Figure 3C:
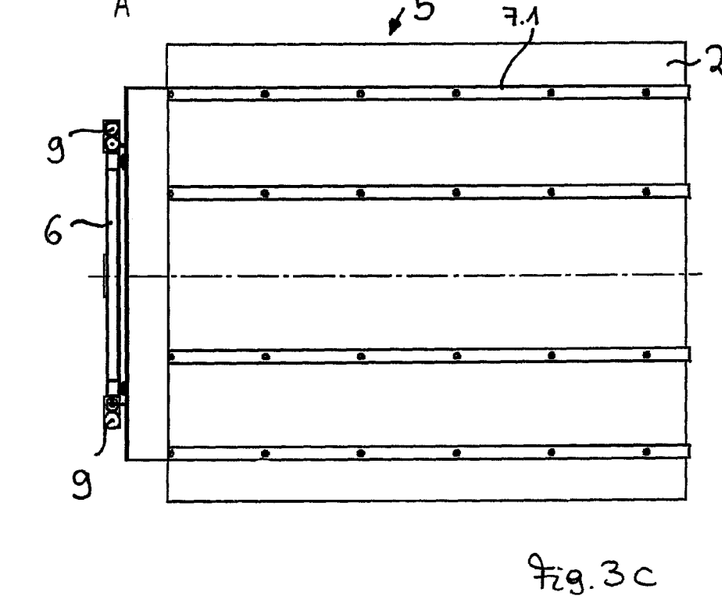
Figure 3D:
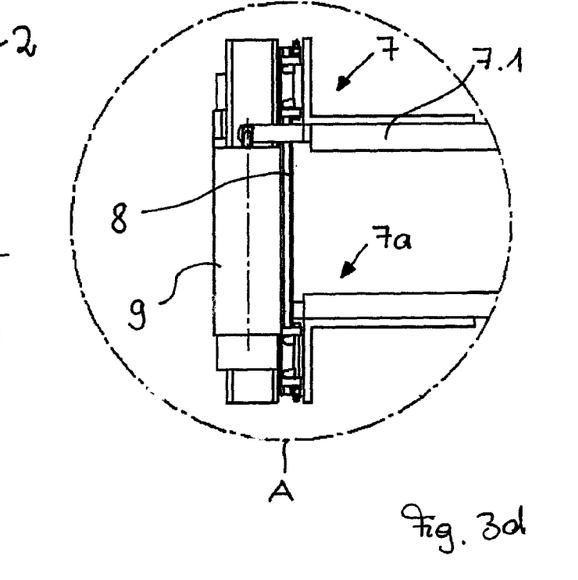
Figure 4:
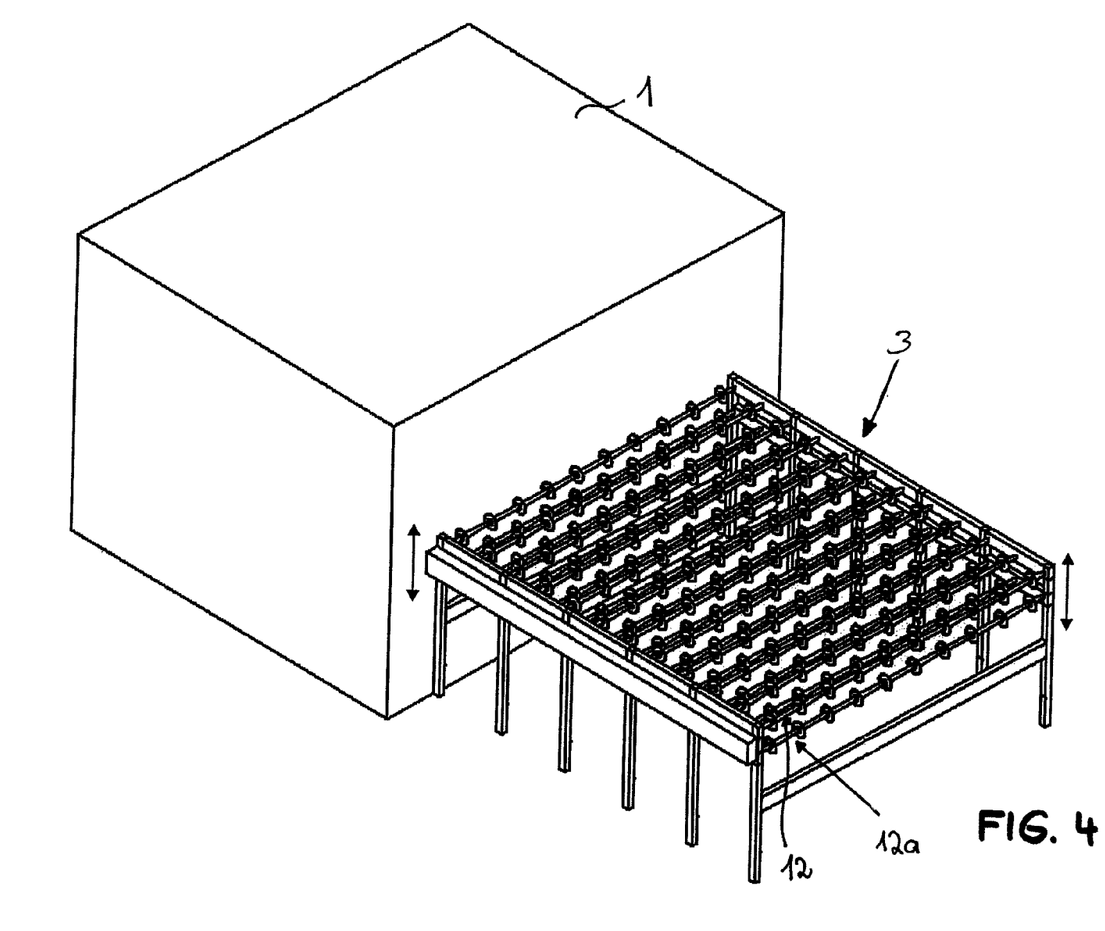
FIG. 4 A perspective representation of an inventive feed unit at a process station.
Figure 5A:
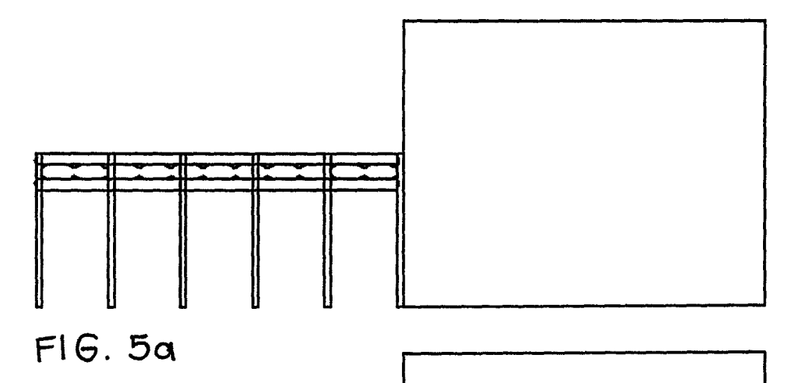
FIG. 5a-c A side view, front view and plan view of an inventive feed unit at a process station.
Figure 5B:
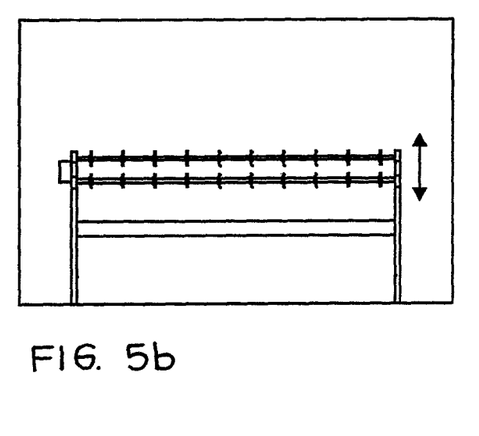
Figure 5C:
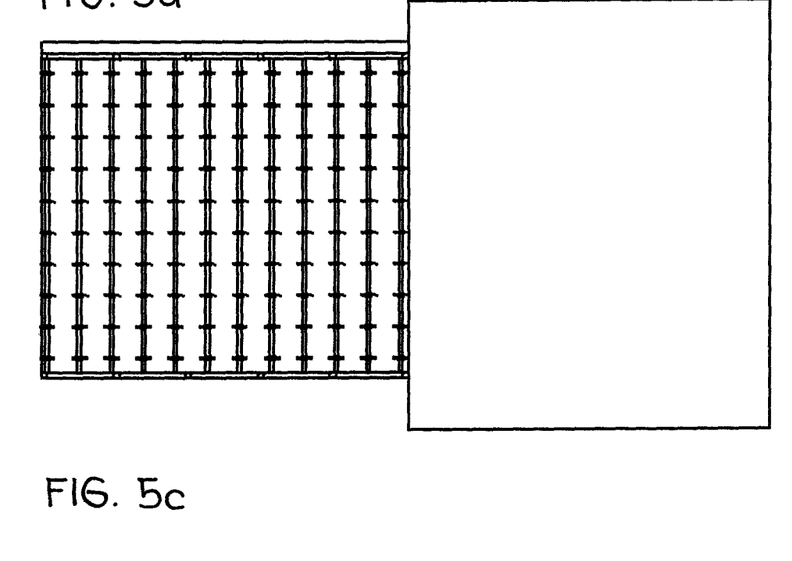
Figure 6:
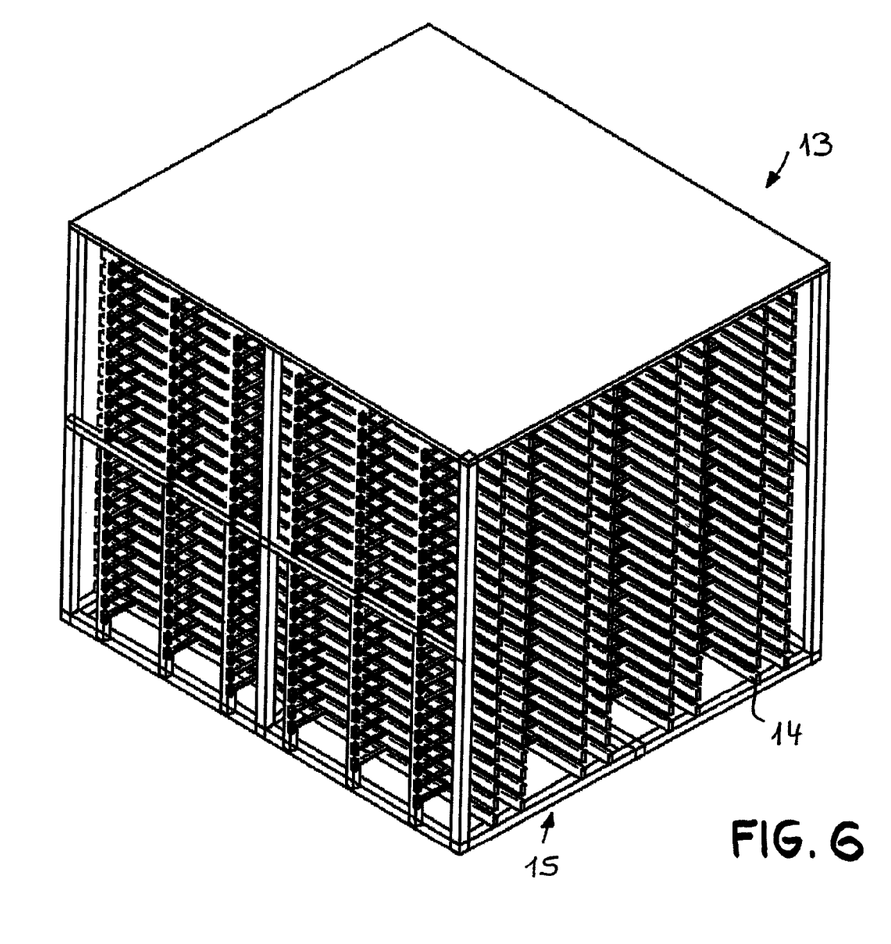
FIG. 6 A perspective representation of a stacking cassette for receiving glass substrate plates usable in the invention.
Figure 7A:
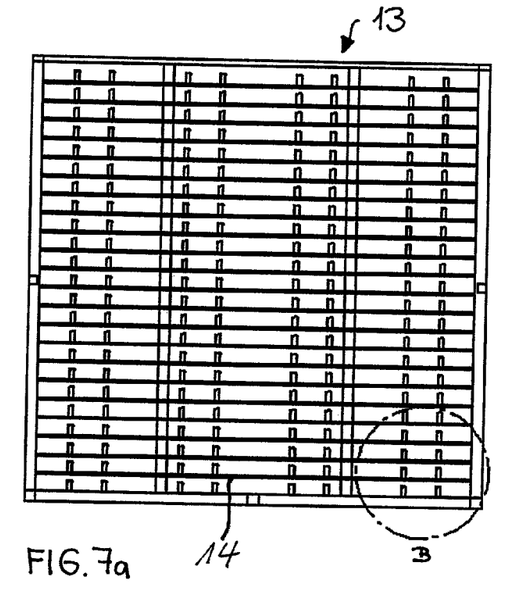
FIG. 7a-c A front view, side view and larger scale view of part B of FIG. 3a of a stacking cassette usable in the invention.
Figures 7B, 7C:
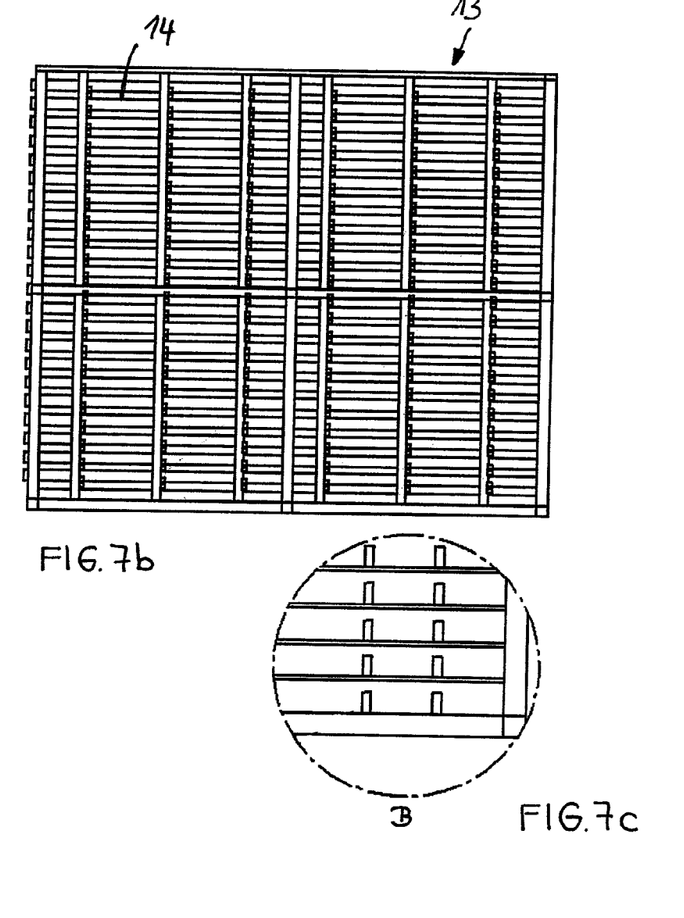

FIG. 1 shows a process station 1 in which glass substrate plates 2, 2a are individually treated or processed. For moving the glass plates 2, 2a into and out of process station 1 an inventively designed feed unit 3 is provided and will be described in greater detail hereinafter. The glass substrate plates 2, 2a are moved by means of a double fork gripper 5 handled by a robot 4 from a storage cassette 13 (FIGS. 6, 7a, 7b) to feed unit 3 and from the latter, after treatment in process station 1, back to the storage cassette 13.

The movement phase of the double fork gripper 5 guided by robot 4 shown in FIG. 1 is e.g. such that the double fork gripper 5 feeds the untreated glass substrate plate 2a to feed unit 3 and in a subsequent step receives and advances the glass substrate plate 2 previously treated in process station 1. (The phase of the double fork gripper 5 shown in FIG. 1 can also be understood in such a way that, following the deposition of the untreated glass substrate plate 2 on feed unit 3, the gripper 5 has received the glass substrate plate 2a already treated in process station 1 and has just removed it from feed unit 3. The following description is, however, based on the first mentioned understanding).

In accordance with FIGS. 2 and 3a-d, the inventive double fork gripper 5 has a base frame 6 on which are fitted in superimposed manner so as to be movable towards and away from one another two individual fork grippers 7, 7a. The fork grippers 7, 7a have fork tines 7.1, which are arranged in spaced manner and in each case define a plane of the fork gripper 7, 7a in which the tines 7.1 are located. Thus, the fork grippers 7, 7a are movable relative to one another in the perpendicular direction defined by the planes. Guides 8 are formed on base frame 6 to permit the movements and movement takes place through drives 9. The drives 9 can be electrical, pneumatic or hydraulic. To produce the relative movement perpendicular to the planes fixed by the individual grippers 7, 7a, both grippers 7, 7a can be moved relative to the base frame 6 or a single gripper can be moved relative to the other gripper and the base frame 6 and in this case there is a compensating movement through the robot to which the double fork gripper 5 is fixed by a flange plate. In the case of relative movements of both fork grippers 7, 7a relative to the base frame 6, this can take place by means of separate drives 9 or by means of a single drive and a suitable coupling mechanism or suitable gear.

For the precise positioning and maintaining of the glass substrate plates, on the fork tines 7.1 of fork grippers 7, 7a there are suction elements 7.2, such as suction cups or the like, which can be vacuumized by suitable devices.

FIGS. 4 and 5a-c show a feed unit 3 as a receiving station for glass substrate plates 2 at process station 1. Feed unit 3 also has two vertically superimposed conveying mechanisms 12, 12a in the form of roller conveyors. The latter are also vertically movable, i.e. perpendicular to the planes defined by the roller conveyors 12, 12a and namely the upper conveying mechanism or roller conveyor 12 from a central insertion position to process station 1 into a transfer station upwards and the lower conveying mechanism or roller conveyor 12 from said central insertion position to process station 1 in the downwards direction. For implementing the vertical lifting movements of the conveyor mechanisms 12, 12a not shown drives are provided. The reception of the glass substrate plates prior to treatment and the depositing thereof after treatment by means of the inventively constructed double fork gripper 5 takes place from and to stacking cassettes 13, as shown in FIGS. 6 and 7a-c.

If conveying mechanism 12a is in the central insertion position, treatment of an untreated glass substrate plate 2a takes place in the following way:

A treated glass substrate plate 2a is transferred from process station 1 to conveying mechanism 12a. Conveying mechanisms 12, 12a move simultaneously downwards. Conveying mechanism 12 then has access to the central insertion position. Double fork gripper 5 moves into feed unit 3. Simultaneously an untreated glass substrate plate 2a is deposited on conveying mechanism 12 and the treated glass substrate plate 2a is received from conveying mechanism 12a. The untreated glass substrate plate 2a is transferred from conveying mechanism 12 into process station 1. The double fork gripper 5 moves the treated glass substrate plate 2a from feed unit 3 and transports it to the cassette.

Figure 8:
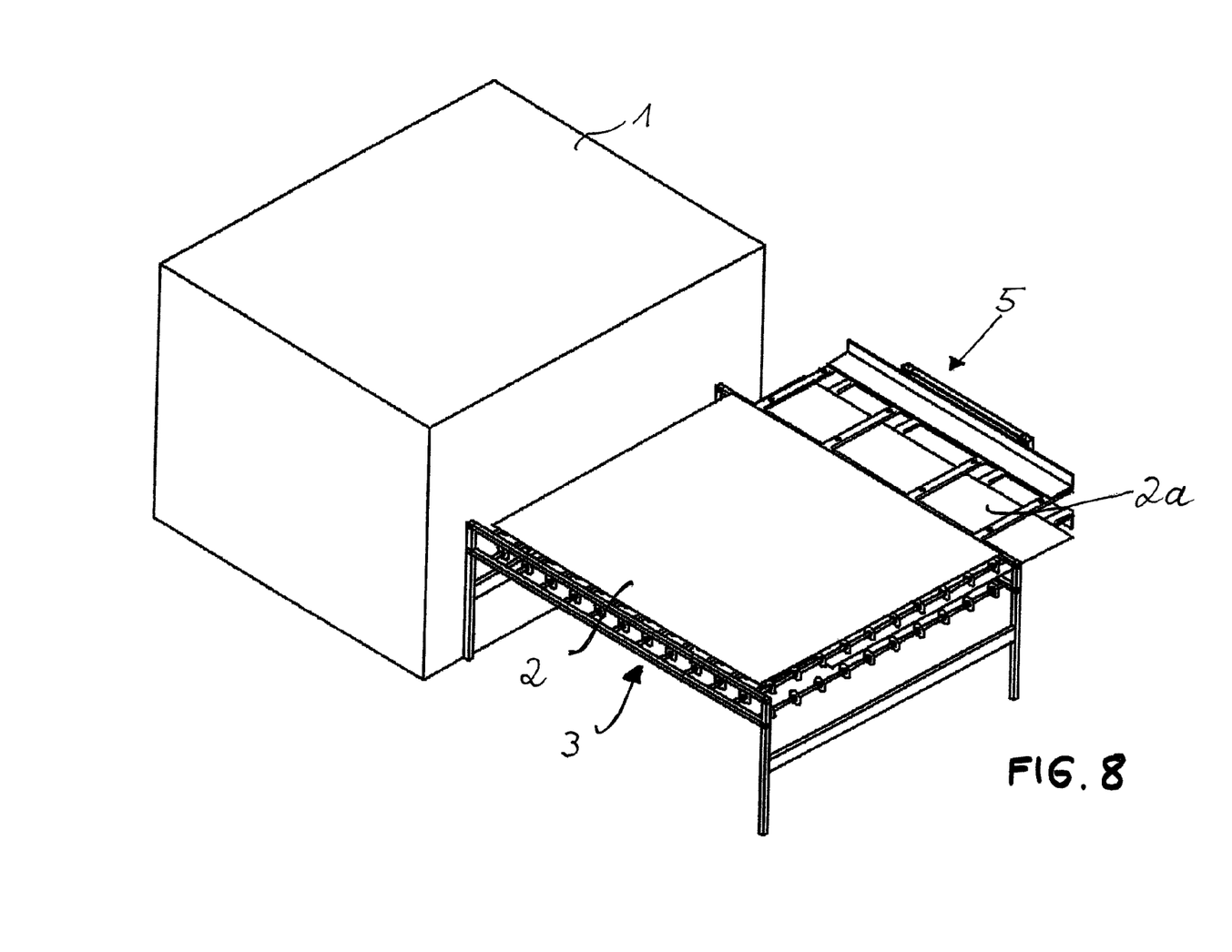
FIG. 8 The lateral moving of a double fork gripper up to a process station feed unit.

The stacking cassettes 13 have horizontally directed, juxtaposed and superimposed retaining arms 14 forming between them receiving or depositing planes for the glass substrate plates 2. The removal and insertion of the glass substrate plates 2, 2a in storage cassettes 13 takes place by means of the front face 15, as is visible in FIG. 7a. In the case of an appropriate design of the cassettes, transfer can take place by means of the side shown in FIG. 7b. In this case the glass substrate plates are received from the wide side and, as is shown in FIG. 8, are transferred to or removed from this side to feed unit 3. Gripping the glass substrate plates 2 on their wider side offers the advantage that on transferring and removing the movement paths are shortened and consequently the cycle times can be further reduced.

The sequence of the inventive method is as follows:

After removing an untreated glass substrate plate from the stacking cassette 13 using the double fork gripper, e.g. on the lower fork gripper 7a, and fixing the glass substrate plate 2a by means of suction cups 7.2 to fork gripper 7a, by means of the double fork gripper 5 the robot 4 transports the glass substrate plate 2a to the feed unit 3 and introduces said plate 2a into the feed unit 3 between the upper and lower conveying mechanisms 12, 12a, i.e. above the lower conveying mechanism 12a, as shown in FIG. 1. The two individual fork grippers 7, 7a are very close to one another (without the upper fork gripper 7 contacting the glass substrate plate 2a), so that the upper fork gripper 7 can also be introduced into the feed unit, namely below the already treated glass substrate plate 2 located there. Following the complete insertion of the double fork gripper 5 into feed unit 3 the lower fork gripper 7a is lowered until the fed-in glass substrate plate 2a rests on conveying mechanism 12a. The upper fork gripper 7 is raised until it acts on the underside of the treated glass substrate plate 2 and raises the latter from the upper conveying mechanism 12. It is important that these movements can take place simultaneously. As stated, the lowering movements of the lower fork gripper and the raising movements of the upper fork gripper can take place in absolute manner against a stationary base frame of the double fork gripper and therefore stationary robot or by movement of one of the fork grippers 7, 7a and corresponding compensating movement of the robot over the base frame 6 of double fork gripper 5.

The robot 4 then draws the glass substrate plate 2 from feed unit 3 by means of double fork gripper 5 and moves together therewith to stacking cassette 13. It introduces there the glass plate 2 into the stacking cassette 13 and the fork grippers 7, 7a remain in their moved apart position, so that fork gripper 7 inserts the glass substrate plate 2 during insertion into stacking cassette 13 above the retaining arms 14 subsequently receiving the same, but simultaneously during the insertion of the lower fork gripper 7 it moves below a further glass substrate plate 2a in a plane below that in which the glass substrate plate 2 is inserted and does not make contact during insertion. Following complete insertion of fork grippers 7, 7a into stakking cassette 13, the inserted glass substrate plate 2 is deposited on the corresponding retaining arms 14 through the lowering of the upper fork gripper 7, an underlying, untreated glass substrate plate 2a is raised by raising fork gripper 7a, so that the double fork gripper 5 is moved together therewith out of the stacking cassette 13 and can bring it to the feed unit 3, in order to deposit it there again and receive a treated glass substrate plate 2 in the manner described.

The invention claimed is:

1. Apparatus for transferring and accepting glass substrate plates, comprising:
   a double fork gripper having two superimposed, individual fork grippers, each individual fork gripper having at least three tines defining an upper surface sized and arranged to engage a bottom surface of a glass substrate to thereby support the glass substrate thereon;
   wherein the tines of one of the superimposed fork grippers are constrained for alignment with the tines of the other fork gripper along a vertical direction;
   wherein the fork grippers are independently movable relative to one another perpendicular to their extension planes such that the fork grippers are not constrained to move simultaneously toward or away from one another; and
   wherein the fork grippers have suction cups for fixing the glass substrate plates.

2. Apparatus according to claim 1, wherein the fork grippers are both movable relative to a base frame carrying the same.

3. Apparatus according to claim 1, wherein the fork grippers are movable relative to one another in directions perpendicular to their extension planes by a common drive and a coupling mechanism or gear.

4. The apparatus of claim 1, further comprising:
   first and second drives, the first drive dedicated for driving a first one of the fork grippers, the second drive dedicated for driving a second one of the fork grippers.

5. The apparatus of claim 1,
   wherein only one of the fork grippers is movable relative to the other fork gripper and a base frame carrying both grippers, and the base frame implements a compensating movement counter to the movement direction of the fork gripper movable relative thereto.

6. Apparatus according to claim 1, wherein a robot is carrying the double fork gripper.

7. The apparatus of claim 1, wherein the fork grippers are adapted to clamp an edge of a glass substrate plate.

8. A feed unit for guiding glass substrate plates to and from a process station having at least one chamber treating the same and two vertically superimposed and vertically movable conveying mechanisms conveying the glass substrate plates into and out of the chamber, and wherein one of the conveying mechanisms receives a glass substrate plate from the chamber simultaneously with the other conveying mechanism unloading a glass substrate plate to the chamber.

9. Feed unit according to claim 8, wherein the conveying mechanisms are constructed as roller conveyors.

10. System for accepting and transferring glass substrate plates to and from a process station, comprising:
    an apparatus for transferring and accepting the glass substrate plates with a double fork gripper having two superimposed, individual fork grippers, wherein the fork grippers are independently movable relative to one another perpendicular to their extension planes such that the fork grippers are not constrained to move simultaneously toward or away from one another; and
    a feed unit for guiding the glass substrate plates to and from at least one chamber of the process station treating the same, wherein the apparatus conveys the glass substrate plates into and out of the at least one chamber, and wherein one of the fork grippers receives a glass substrate plate from the at least one chamber simultaneously with the other fork gripper unloading a glass substrate plate to the at least one chamber.

* * * * *